US012683565B2

(12) United States Patent
Javvaji et al.

(10) Patent No.: US 12,683,565 B2
(45) Date of Patent: Jul. 14, 2026

(54) CHOPPER CIRCUIT FOR MULTIPATH CHOPPER AMPLIFIER AND CORRESPONDING METHOD OF CHOPPING

(71) Applicant: NXP B.V., Eindhoven (NL)

(72) Inventors: Sundeep Lakshmana Javvaji, Delft (NL); Muhammed Bolatkale, Delft (NL); Lucien Johannes Breems, Waalre (NL); Kofi Afolabi Anthony Makinwa, Delft (NL)

(73) Assignee: NXP B.V., Eindhoven (NL)

( * ) Notice: Subject to any disclaimer, the term of this patent is extended or adjusted under 35 U.S.C. 154(b) by 543 days.

(21) Appl. No.: 18/316,325

(22) Filed: May 12, 2023

(65) Prior Publication Data

US 2023/0370031 A1      Nov. 16, 2023

(30) Foreign Application Priority Data

May 13, 2022      (EP) ..................................... 22173294

(51) Int. Cl.
  *H03F 3/387*      (2006.01)
  *H03F 1/26*      (2006.01)
(52) U.S. Cl.
  CPC .............. *H03F 3/387* (2013.01); *H03F 1/26* (2013.01); *H03F 2200/372* (2013.01)
(58) Field of Classification Search
  CPC ...... H03F 3/387; H03F 1/26; H03F 2200/372; H03F 2200/375; H03F 2203/45212; H03F 3/45179; H03F 3/45775; H03F 3/393; H03F 3/45475; H03M 3/34; H03M 3/344; H03M 3/458; H02M 3/00
  USPC ............................................... 330/9, 252–261
  See application file for complete search history.

(56) References Cited

U.S. PATENT DOCUMENTS

| | | | |
|---|---|---|---|
| 6,734,723 B2 * | 5/2004 | Huijsing ................. | H03F 3/347 330/9 |
| 7,091,771 B2 | 8/2006 | Thompson et al. | |
| 2015/0288336 A1 * | 10/2015 | Kusuda ................... | H03F 3/387 330/9 |

OTHER PUBLICATIONS

Billa, S., "A 280μW 24kHz-BW 98.5dB-SNDR Chopped Single-Bit CT AΣM Achieving <10Hz 1/f Noise Corner Without Chopping Artifacts", 2016 IEEE International Solid-State Circuits Conference (ISSCC), Session 15, Oversampling Data Converters, Jan. 31, 2016.

(Continued)

*Primary Examiner* — Hieu P Nguyen

(57) ABSTRACT

A chopper circuit (100) for a multipath chopper amplifier (201) is described. The chopper circuit (100) comprises a first chopper device (110) in a first circuit path (111), wherein the first chopper device (110) is configured to be controlled by a first clock signal (315), which has a first frequency; and a second chopper device (120) in a second circuit path (121), parallel to the first circuit path (111), wherein the second chopper device (120) is configured to be controlled by a second clock signal (325), which has a second frequency, wherein the first frequency is greater than the second frequency. Furthermore, a corresponding method of chopping an input signal (102) is described.

20 Claims, 3 Drawing Sheets

(56)  References Cited

OTHER PUBLICATIONS

Billa, S., "Analysis and Design of Continuous-Time Delta-Sigma Converters Incorporating Chopping", IEEE Journal of Solid-State Circuits, vol. 52, No. 9, Sep. 2017.

Pavan, S., "Improved Chopping in Continuous-Time Delta-Sigma Converters Using FIR Feedback and N-Path Techniques", IEEE Transactions on Circuits and Systems—II: Express Briefs, vol. 65, No. 5, May 2018.

* cited by examiner

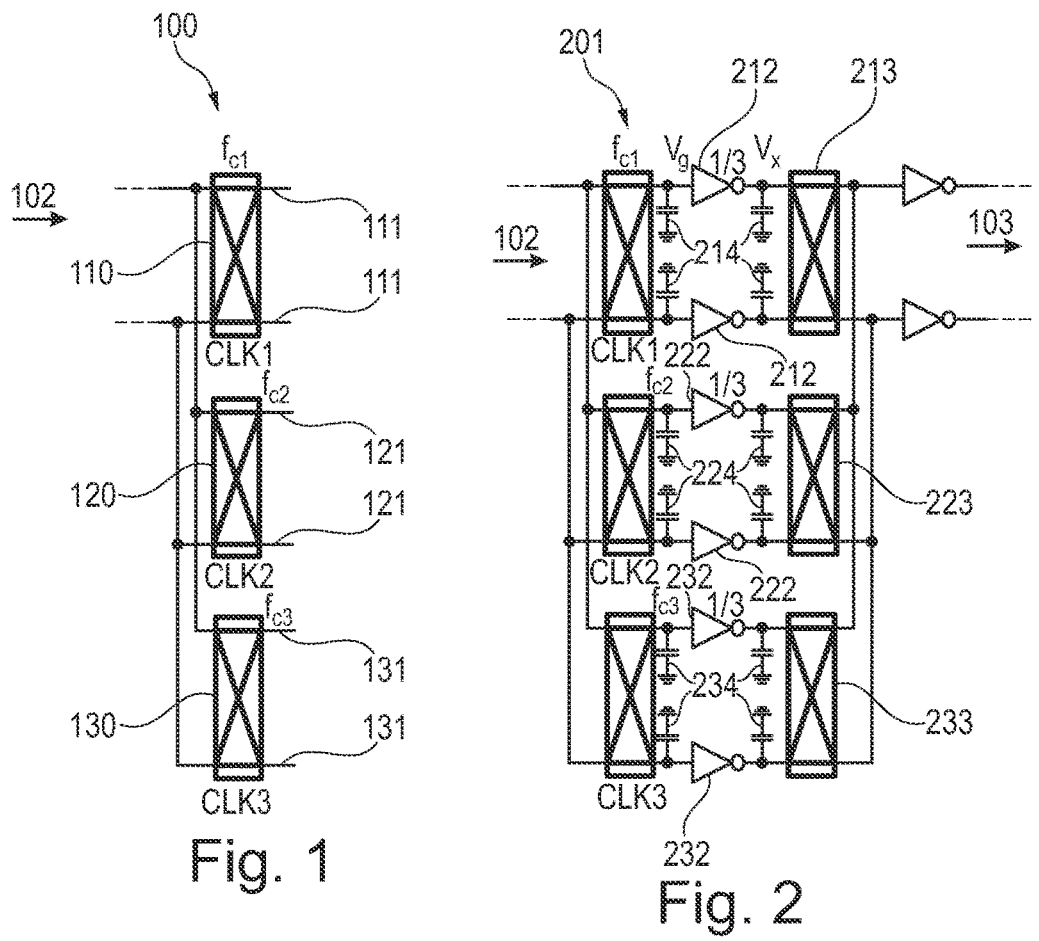
Fig. 1
Fig. 2
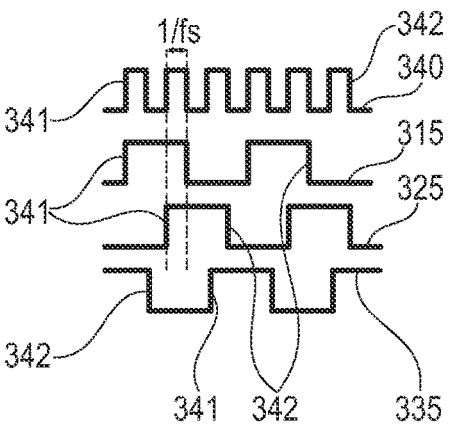
Fig. 3
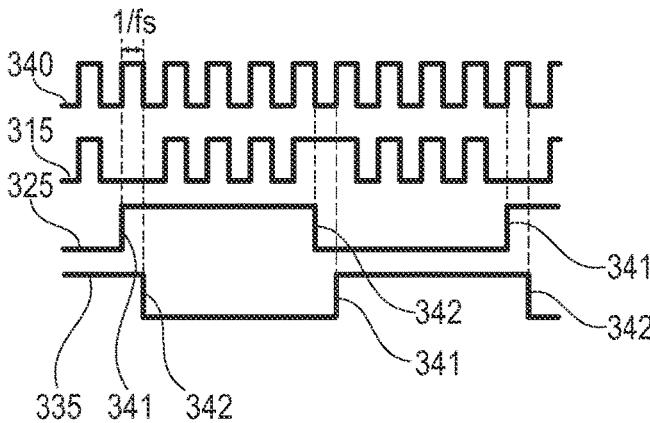
Fig. 4

CHOPPER CIRCUIT FOR MULTIPATH CHOPPER AMPLIFIER AND CORRESPONDING METHOD OF CHOPPING

CROSS-REFERENCE TO RELATED APPLICATIONS

This application claims the priority under 35 U.S.C. § 119 of European Patent application no. 22173294.4, filed on 13 May 2022, the contents of which are incorporated by reference herein.

TECHNICAL FIELD

The present disclosure relates to a chopper circuit for a multipath chopper amplifier and a corresponding method of chopping. In this context, the present disclosure may refer to the technical field of signal amplification.

TECHNICAL BACKGROUND

Inverter-based amplification is an established technique used for example in high-resolution and high-speed analog-to-digital converters (ADC). The dynamic range of such continuous-time delta-sigma modulators is limited at low frequencies, i.e. until a few 10s of MHz in advanced CMOS technologies, by the flicker noise added by the first integrator in the loop filter. Chopping the first stage of the first integrator can modulate the flicker noise outside the signal bandwidth, which a decimation filter can later remove. Chopping causes the sampling of the voltage present at the parasitic capacitors of the virtual ground due to the limited gain and bandwidth of the amplifier into the integrating capacitor. This sampling action can cause folding of quantization noise from multiples of twice the chopping frequency. Chopping at half the sampling frequency, i.e. $f_s/2$, can avoid this noise folding due to zeros of the noise transfer function (NTF) at multiples of the sampling frequency $f_s$. A disadvantage of this high-frequency chopping is reduced effective amplifier gain and increased amplifier's thermal noise when referred to the input of the delta-sigma ADC. Multipath chopping techniques can improve these chopping artifacts but are prone to the mismatch between the paths.

OBJECT AND SUMMARY OF THE DISCLOSURE

An object of the present disclosure is to improve the overall performance of a multipath chopper amplifier including mismatch performance between different paths.

In order to achieve this object, a chopper circuit and a method of chopping an input signal according to the independent claims are provided.

According to an aspect of the present disclosure, a chopper circuit for a multipath chopper amplifier is provided. The chopper circuit comprises a first chopper device in a first circuit path, wherein the first chopper device is configured to be controlled by a first clock signal, which has a first frequency. The chopper circuit further comprises a second chopper device in a second circuit path, parallel to the first circuit path, wherein the second chopper device is configured to be controlled by a second clock signal, which has a second frequency. The first frequency is greater than the second frequency.

According to a further aspect of the present disclosure, a method of chopping an input signal is provided. The method comprises splitting the input signal so that a first path signal for a first circuit path and a second path signal for a second circuit path are provided; chopping the first path signal by means of a first chopper device in the first circuit path, wherein the first chopper device is controlled by a first clock signal, which has a first frequency; and chopping the second path signal by means of a second chopper device in the second circuit path, wherein the second chopper device is controlled by a second clock signal, which has a second frequency. The first frequency is greater than the second frequency. The first path signal may be the same as the second path signal.

In the context of the present disclosure, a "chopper device" may refer to a switching device. The chopper device may comprise one switch or a plurality of switches. It may be configured to convert a fixed DC input voltage to a variable DC output voltage, which may for example correspond to an AC output voltage having a rectangular shape. The chopper device may be configured to modulate a signal received by the chopper device, e.g. in a periodic manner. For example, it may turn the received signal on and off in a periodic manner, it may reverse the sign of the signal in a periodic manner and/or a connection between different signal inputs of the chopper device and different signal outputs of the chopper device may be changed in a periodic manner. More generally, the chopper device may be configured to allow for any kind of non-periodic or periodic changes of the input signal.

"Chopping" of a signal may refer to a type of modulation realized by means of one or more chopping devices. The modulation may involve a rectangular or approximately rectangular carrier signal, which may be implemented by switches of the chopping device. The carrier signal may have any other periodic or quasiperiodic form. The carrier signal may be modulated by a signal received at an input of the chopping device. The modulated signal may be output by the chopping device.

A "chopper circuit" may refer to a circuit or circuitry, which incorporates one or more chopper devices. The chopper circuit may be, but need not be a closed circuit. The chopper circuit may form part of a chopper amplifier circuit, which in turn may form part of an inverter-based amplifier used in a delta-sigma modulator.

The chopper circuit may have an "input", at which an "input signal" is received. The input may comprise one or more line inputs, each corresponding to a respective signal conductor for conducting or transmitting the signal. A signal conductor may for example be an optical or electrical cable or wire. The input signal may be a differential signal received at two line inputs and transmitted by a pair of signal conductors. The chopper circuit may have an output, at which an output signal is provided. The output may comprise one or more line outputs, each corresponding to a respective signal conductor. The output signal may be a differential signal output at two signal outputs. The input signal and/or output signal may for example be characterized in terms of at least one of a frequency, an amplitude, a voltage and an electric current.

The chopper circuit may have different "circuit paths", which may each lead from the input of the chopper circuit to the output of the chopper circuit. Each circuit path may comprise one or several signal conductors, in particular two signal conductors for conducting a differential signal. Different circuit paths may have a common starting point and/or a common end point. Different circuit paths may or may not partially coincide, i.e. be at least partially realized by the same signal conductors. "Parallel" circuit paths may be defined by a common starting point and/or a common end point as well as a same direction of signal transmission from that starting point and/or to that end point. "Splitting" an input signal may refer to the partition or duplication of the input signal at a branching point, in particular a branching point, at which different circuit paths diverge. The input signal may be the same for all circuit paths.

In the context of the present disclosure, a "clock signal" may be a signal produced by a clocking device, e.g. a clock generator. All clock signals may be produced by a master clock generator or at least some, in particular all, of the clock signals may be produced by respective individual clock generators. The clock signal may be periodic. It may be a signal oscillating periodically between a high state and a low state. An "upward clock edge" or rising clock edge may connect the low state with the high state. A "downward clock edge" or falling clock edge may connect the high state with the low state. The clock signal may for example have the form of a square wave or at least approximately a square wave. For an approximate square wave, at least some of the corners of the square may be rounded and/or at least some of the upward and/or downward clock edges may not be exactly vertical, but may deviate by an angle smaller than 10°, in particular smaller than 5°, in particular smaller than 1°. The clock signal may have any other periodic or quasi-periodic form. At certain time intervals, a period or at least a part of a period may be omitted in the clock signal. A duty cycle of the clock signal, defined as the ratio of the duration of the high state, e.g. pulse duration, to the total period of the wave form, may be 50%. It may also deviate from 50%.

The "frequency" of the clock signal may refer to the number of occurrences of periods of the clock signal per unit of time. It may for example refer to at least one of the number of rising edges per unit of time, the number of falling edges per unit of time, the number of maxima per unit of time, the number of minima per unit of time. The clock signal may only be approximately periodic with respect to the frequency. For example, there may be deviations of the clock signal at a frequency smaller than the frequency of the clock signal, which may be a multiple of the smaller frequency. The frequency of the clock signal may be determined based on a corresponding fully periodic signal without deviations, e.g. without omissions of edges.

That a chopper device is "controlled by a clock signal" may imply that a signal received by the chopper device modulates a carrier signal provided by the chopper device and derived from the clock signal. That the chopper device is controlled by the clock signal may imply that one or more switches of the chopper device are switched in accordance with the clock signal, for example with the frequency of the clock signal. The signal received by the chopper device may be blocked according to the clock signal, its sign may be reversed according to the clock signal and/or signal outputs of the chopper device may be exchanged according to the clock signal.

According to an exemplary embodiment, the present disclosure may be based on the idea to provide a chopper circuit for a multipath chopper amplifier that improves performance of the chopper circuit and therefore of the amplifier. Such a chopper amplifier may have an improved signal level with respect to the noise level. Different types of noise may be prevalent, in particular flicker noise, also known as 1/f noise due to its 1/f characteristic, thermal noise, which may be constant across all frequencies, and quantization noise. By means of chopping, the flicker noise may be modulated to a higher frequency. Chopping at half the sampling frequency, i.e. $f_s/2$, may be able to avoid quantization noise folding in a delta-sigma modulator. But such high-frequency chopping may have disadvantages such as reduced effective amplifier gain and increased amplifier's thermal noise when referred to the input of the delta-sigma ADC.

Multipath chopping techniques can improve these chopping artifacts but are prone to mismatches between different paths. Path mismatches may be due to a clocking skew, i.e. a slight error in synchronization between different paths, e.g. a slight offset of a clock signal with respect to a master clock, and/or due to mismatches between parasitic capacitors at the input choppers and output choppers, i.e. demodulators, in different paths. The parasitic capacitors may result from amplifier implementation.

Mismatch performance may be improved by chopping one of the paths at a higher frequency relative to the other paths. For example, if a first path is chopped at a first frequency greater than a second frequency at which a second path is chopped, there may be fewer mismatches and mismatches may have less impact in comparison to chopping these paths at the same frequency. Since sampling happens from the first path more often than from the second path, the magnitude of folding is reduced if there is a mismatch between the different paths. Since mismatches may cause residual folding, if there are less opportunities for mismatches, there may be an improvement in the overall folding signal level.

DESCRIPTION OF EXEMPLARY EMBODIMENTS

In the following, further exemplary embodiments of the chopper circuit and the corresponding method of chopping an input signal will be explained.

According to an exemplary embodiment, the first frequency is half a sampling frequency or a multiple of half the sampling frequency. The sampling frequency may be a sampling frequency of the chopper amplifier or of an analog-to-digital converter comprising the chopper amplifier. The "sampling frequency" may be a frequency with which samples are obtained, e.g. the average number of samples obtained per unit of time. The sampling frequency may be defined with respect to a reference clock. It may be twice the frequency of the reference clock. Setting the first frequency equal to half the sampling frequency or a multiple thereof may be advantageous in order to ensure that the flicker noise is modulated outside the signal bandwidth.

According to a further exemplary embodiment, the second frequency is in the range from 1 to 2 times, in particular from 1 to 1.5 times, in particular from 1 to 1.1 times, the sum of a signal bandwidth plus a flicker noise corner frequency. The upper boundary of these intervals may be determined by how fast the decimation filter rolls off. The "flicker noise corner frequency" may be defined as the frequency at which the flicker noise equals the thermal noise. The signal bandwidth may refer to the input bandwidth of an analog-to-digital converter (ADC) comprising the multipath chopper amplifier. The amplifier in general may have a higher or much higher bandwidth due to over-sampling in a delta-sigma modulator.

Setting the second frequency in the above-defined range may be advantageous because the sum of the signal bandwidth plus the flicker noise corner frequency may be the lowest possible frequency so that the flicker noise is modulated outside the signal bandwidth or at least to an edge of the signal bandwidth. At the same time, choosing the second frequency and possibly a third frequency as small as possible may be advantageous to improve mismatch performance. For example, by choosing low frequencies in 2 paths of a 3-path chopper amplifier, the magnitude of folding of out-of-band interferers can be reduced if there is a mismatch between the three paths.

According to a further exemplary embodiment, the first frequency is a multiple of the second frequency. The multiple may be chosen such that, for a fixed first frequency, the second frequency is as close to the sum of signal bandwidth plus flicker noise corner frequency as possible, while being greater than the sum. Certain features such as upward and/or downward edges may be lacking in the first clock signal having the first frequency. If these features are omitted in a periodic manner, then they are omitted at a frequency, of which the first frequency is a multiple. A corresponding second clock signal having the second frequency may comprise the omitted features. Thus, the above-described embodiment may be advantageous in order to provide a combined clock signal, in which upward clock edges and/or downward clock edges occur at the first frequency. As long as there is one chopping edge in every sampling period of a multipath chopper amplifier irrespective of the path, there may not be folding of quantization noise.

According to a further exemplary embodiment, at least one of the first, second and third clock signals comprises upward clock edges, which occur with the frequency of the respective clock signal, and/or downward clock edges, which occur with the frequency of the respective clock signal. The upward clock edges may connect low states of the clock signal with high states of the clock signal. The downward clock edges may connect high states with low states. Clock signals with upward and/or downward clock edges may be particularly suitable to control chopper devices, in particular switches forming part of the chopper devices.

According to a further embodiment, for at least one, in particular for each, of the clock signals, the time interval between an upwards clock edge and a subsequent downwards clock edge corresponds to the time interval between a downwards clock edge and a subsequent upwards clock edge. Such a signal may be particularly suitable as a control signal due to its symmetrical properties.

According to a further exemplary embodiment, in the first clock signal, upward clock edges are omitted with a frequency equal to the second frequency and/or downward clock edges are omitted with a frequency equal to the second frequency. For each of the omitted upward clock edges, there may be an adjacent omitted downward clock edge and/or vice versa. The omitted edges of the first clock signal may form part of the second clock signal and/or of a further clock signal, e.g. a third clock signal. This may be advantageous because, as long as there is one chopping edge in every sampling period of a multi-path chopper amplifier irrespective of the path, there may be no folding of quantization noise. The above-described feature may be advantageous in order not to fold any quantization noise in the context of a delta sigma modulator.

According to a further embodiment, the chopper circuit comprises an odd number of chopper devices and/or an odd number of circuit paths, wherein in particular the odd number may be three. Such an embodiment may be advantageous to ensure appropriate matching between paths. In particular, an odd number of chopper devices and corresponding number of circuit paths may simplify the generation of upward and downward edges which match the upward and downward edges of a reference clock, e.g. having a frequency of half the sampling frequency.

According to a further exemplary embodiment, the chopper circuit further comprises a third chopper device in a third circuit path, in particular parallel to the first and/or second circuit paths, wherein the third chopper device is configured to be controlled by a third clock signal, which has a third frequency. There may be exactly three chopper devices in the chopper circuit. Having three chopper devices may be advantageous for ensuring that there is one chopping edge of the combined clock signal in every sampling period, while keeping the overall number of chopper devices low in the interest of an economical use of parts.

According to a further exemplary embodiment, the third frequency equals the second frequency. In this way, path mismatch may be reduced as much as possible, since both the second and the third frequencies can be minimized with the sum of the signal bandwidth and the flicker noise corner frequency being a lower limit.

According to a further exemplary embodiment, the third clock signal corresponds to the second clock signal shifted in time, in particular such that a time difference between an upward clock edge of the second clock signal and a downward clock edge of the third clock signal and/or a time difference between a downward clock edge of the second clock signal and an upward clock edge of the third clock signal is one over twice the first frequency $\frac{1}{2}f_1$ and/or one over the sampling frequency $1/f_s$. The third clock signal may be shifted by two over the second frequency plus or minus one over the first frequency, i.e. $2/f_2 \pm 1/f_1$. Such an embodiment may be advantageous to complement omitted features in the first clock signal, while keeping the second and third frequencies low.

According to a further exemplary embodiment, a combined clock signal composed of the first, the second and the third clock signals has exactly one upward clock edge or downward clock edge occurring at the sampling frequency and/or twice the first frequency, wherein in particular upward clock edges and downward clock edges alternate. The combined clock signal may correspond to the sum of the first, the second and the third clock signals, possibly multiplied by a factor and/or with an offset added. If there are further clock signals, the combined clock signal may correspond to the sum of all clock signals. The embodiment may be advantageous, because there may be no folding of quantization noise as long as there is one chopping edge in every sampling period of a multi-path chopper amplifier irrespective of the path. In order not to fold any quantization noise, only one chop edge may be in every sampling period 1/fs. For that reason, the chopping edges in the first clock may be removed whenever there are chopping edges, i.e. upward or downward clock edges, in the second and third clock signals.

According to a further exemplary embodiment, the chopper circuit further comprises at least one further chopper device, each in a respective circuit path and each configured to be controlled by a respective clock signal having a respective frequency. A combined clock signal may have exactly one upward clock edge or downward clock edge occurring at the sampling frequency ($f_s$) and/or twice the first frequency. The combined clock signal may be composed of all clock signals, i.e. the first, second, third and all further clock signals. Upward clock edges and downward clock edges may alternate in the combined clock signal. The frequencies of the clock signals associated with the further chopper devices may equal the second frequency and/or third frequency. They may all be smaller than the first frequency. In particular, the chopper circuit may comprise a fourth and/or a fifth chopper devices. The corresponding fourth and fifth frequencies may equal the second and/or third frequencies.

According to a further embodiment, there can be n number of circuit paths, wherein in particular as low frequency as possible is chosen for n−1 paths. This may improve mismatch performance. Clock edges for the other clock may need to be adjusted to get one clock edge in every sampling period. This may be advantageous in order not to fold quantization noise in a delta-sigma modulator.

According to a further exemplary embodiment, a chopper amplifier circuit is provided comprising the chopper circuit described in the present disclosure. The chopper amplifier may comprise a respective amplifier in each circuit path and/or a demodulator in each circuit path. The chopper amplifier circuit may be configured to amplify an input signal received by the chopper amplifier circuit.

According to a further exemplary embodiment, an integrator circuit is provided comprising the above-described chopper amplifier circuit. The integrator circuit may be an integrator circuit of a first integrator. This may be advantageous, because flickering noise may be most prevalent for the first integrator and the chopper amplifier circuit may be adapted to reduce or mitigate such flickering noise.

According to a further exemplary embodiment of a method of chopping an input signal, a third path signal for a third circuit path is additionally provided, when the input signal is split, and the method further comprises chopping the third path signal by means of a third chopper device in the third circuit path, wherein the third chopper device is controlled by a third clock signal, which has a third frequency. Having three chopper devices may be advantageous for ensuring that there is one chopping edge of the combined clock signal in every sampling period, while keeping the overall number of chopper devices low in the interest of an economical use of parts.

The aspects defined above and further aspects of the present disclosure are apparent from the examples of embodiment to be described hereinafter and are explained with reference to these examples of embodiment. The disclosure will be described in more detail hereinafter with reference to examples of embodiment but to which the disclosure is not limited.

BRIEF DESCRIPTION OF THE DRAWINGS

FIG. 1 shows a chopper circuit according to an exemplary embodiment of the present disclosure.

FIG. 2 shows a chopper amplifier circuit according to an exemplary embodiment of the present disclosure.

FIG. 3 shows clock signals for a chopper circuit for comparison.

FIG. 4 shows clock signals for a chopper circuit according to an exemplary embodiment of the present disclosure.

The illustrations in the drawings are schematic. In different drawings, similar or identical elements may be provided with the same reference signs.

DESCRIPTION OF THE DRAWINGS

Figures 5, 6, 7:
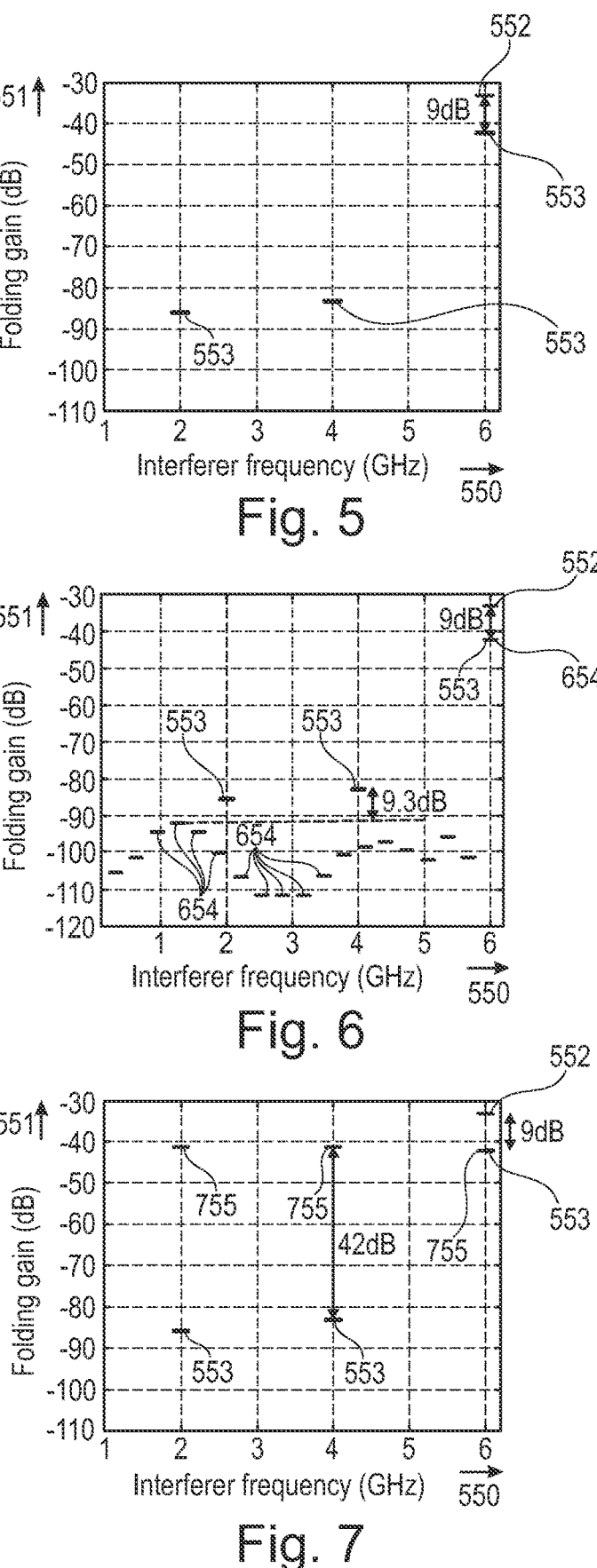
FIGS. 5 to 7 illustrate the folding gain dependent on interferer frequency for different chopping methods according to exemplary embodiments of the present disclosure.

FIG. 1 shows a chopper circuit 100 for a multipath chopper amplifier according to an exemplary embodiment of the present disclosure, specifically a 3-path chopper circuit for a 3-path chopper amplifier. The chopper circuit 100 comprises (i) a first chopper device 110 in a first circuit path 111, wherein the first chopper device 110 is configured to be controlled by a first clock signal 315 (see FIG. 4), which has a first frequency; and (ii) a second chopper device 120 in a second circuit path 121, parallel to the first circuit path 111, wherein the second chopper device 120 is configured to be controlled by a second clock signal 325 (see FIG. 4), which has a second frequency. The first frequency is greater than the second frequency. The chopper circuit 100 further comprises (iii) a third chopper device in a third circuit path 131, which is parallel to the first and second circuit paths, wherein the third chopper device 130 is configured to be controlled by a third clock signal 335 (see FIG. 4), which has a third frequency.

An input signal 102, received by means of two signal conductors, is chopped by the chopper circuit 100. To that effect, the input signal 102 is split so that a first path signal for a first circuit path 111, a second path signal for a second circuit path 121 and a third path signal for a third circuit path 131 are provided. The first, second and third paths 111, 121, 131 are each realized by two signal conductors. The first path signal is chopped by means of the above-described first chopper device 110 in the first circuit path 111. Likewise, the second and third path signals are chopped by the second and third chopper devices 120, 130, respectively.

FIG. 2 shows a 3-path chopper amplifier circuit 201 according to an exemplary embodiment of the present disclosure. The chopper amplifier circuit 201 comprises the chopper circuit 100 of FIG. 1. An input signal 102 is received at an input of the chopper amplifier circuit 201. The input signal 102 is split into a first path signal, a second path signal and a third path signal for respective paths. Each path signal is chopped by a respective chopper device 110, 120, 130 and then amplified by respective amplifiers 212, 222, 232. The path signals are demodulated by respective demodulators 213, 223, 233, realized by output choppers, and then combined to yield an output signal 103. Parasitic capacitors 214, 224, 234 are shown next to the amplifiers 212, 222, 232 in the respective paths.

FIG. 3 shows a first clock signal 315, a second clock signal 325, and a third clock signal 335 for a 3-path chopper circuit for comparison. Each clock signal is a rectangular signal having upward clock edges 341 and downward clock edges 342. The clock signals 315, 325, 335 have the same frequency $f_s/6$, where $f_s$ is the sampling frequency. They are identical signals shifted in time with respect to each other. The combined clock signal of the three clock signals 315, 325, 335 corresponds to the reference clock signal 340 with frequency $f_s/2$ as indicated in an exemplary manner by the dashed lines.

In a corresponding 3-path chopper amplifier (cp. FIG. 2), when controlled by the clock signals 315, 325, 335 of FIG. 3, all the paths are chopped at an equal frequency of $f_s/6$, and clock edges between different paths occur periodically. The chopping clock has a fixed duty cycle of 50%. So, all three paths are sampled an equal number of times. These sampled voltages can be different if there is a mismatch between the different paths used in the multi-path chopper amplifier. This mismatch is either due to the clocking skew or mismatch between the parasitic capacitors at the input choppers and output choppers. This can cause residual folding from multiples of $f_s/3$. Quantization noise still folds from multiples of $f_s$ as there is one chopping transition in every sampling period ($1/f_s$). Quantization noise is negligible at multiples of $f_s$ due to NTF zeros, i.e. zeros of the noise transfer function.

Since each path is chopped at $f_s/6$, quantization noise can fold from multiples of $f_s/3$ if there is a mismatch between the three paths.

FIG. 4 shows a first clock signal 315, a second clock signal 325, and a third clock signal 335 for a 3-path chopper circuit for a chopper circuit according to an exemplary embodiment of the present disclosure. Each clock signal 315, 325, 335 is a rectangular signal having upward clock edges 341 and downward clock edges 342. The first clock signal 315 has a first frequency $f_1=f_s/2$, which is greater than the second frequency $f_2=f_s/18$ of the second clock signal 325 and the third frequency $f_3=f_s/18$ of the third clock signal 335. The time difference between a rising and/or a falling clock edge of the second clock signal 325 and a falling and/or rising clock edge of the third clock signal 335 is $1/f_s$, respectively. The second and third clock signals 325, 335 are identical signals shifted by $8/f_s$ or $10/f_s$ with respect to each other. In the first clock signal 315, certain upward and downward clock edges are omitted at instances, where there are corresponding clock edges in the second or third clock signals 325, 335. The combined clock signal of the three clock signals 315, 325, 335 corresponds to the reference clock signal 340 with frequency $f_s/2$ as indicated in an exemplary manner by the dashed lines.

If a 3-path chopper amplifier (see e.g. FIG. 2) is controlled by the clocking scheme depicted in FIG. 4, two paths are chopped at a lower frequency (low-frequency chopper). In order not to fold quantization noise, there should be exactly one chopping edge in every sampling period ($1/f_s$). So, whenever there is a chopping clock edge in the low-frequency chopping paths (associated with clock signals 325, 335), there is no chopping edge in the high-frequency chopping path (associated with clock signal 315).

Since there are more chopping edges in the path where there is a higher frequency chopper, most of the time, sampling happens from that path. In principle, if the frequency of the low-frequency chopping paths is further reduced, a single path is sampled more often. The lowest frequency possible may be $f_{BW}$ (bandwidth)$+f_{flick}$ (flicker noise corner) so that the flicker noise is modulated outside the signal bandwidth. Since sampling happens from one path more often than from the other paths, the magnitude of folding is reduced if there is a mismatch between the different paths.

FIGS. 5 to 7 illustrate the folding gain (dB) 551 dependent on interferer frequency (GHz) 550 for different chopping methods according to an exemplary embodiment of the present disclosure.

FIG. 5 shows the folding gain 552 from the input signal level to the folded signal level in a continuous-time delta-sigma modulator with a chopper with out-of-band interferers. As chopping at $f_s/2$ causes sampling of the virtual ground at $f_s$, signal content around $f_s$ at the virtual ground fold backs to in-band frequencies. There is no folding of quantization noise because of nulls created by the noise transfer function around multiples of $f_s$. But, out-of-band interferers around $f_s$ can fold back to in-band frequencies. Regarding the folding gain 553 of a 3-path chopper amplifier, folding from $f_s$ reduces by a factor of 3 (9 dB). 3-path chopper amplifiers also cause additional residual folding from multiples of $f_s/3$ with 1% mismatch.

FIG. 6 shows the interferer folding gain 654 with a clocking technique, where the frequencies of a second and third clock signal are smaller than the frequency of a first clock signal. Frequency of the low-frequency choppers is $f_s/38$. With 1% mismatch, interferers fold from multiples of $f_s/19$. There is about 9 dB improvement in the overall folding signal level with the proposed clocking technique. This can further be improved by reducing the frequency of the low-frequency choppers, which in this design is limited by the low over-sampling ratio of 28.

FIG. 7 shows for comparison the folding gain 755 of another technique, FIR DAC, to reduce the chopping frequency in a continuous-time delta-sigma modulator without fold the quantization noise. An N-tap FIR DAC creates notches in the DAC output at multiples of $f_s/N$. By choosing the chopping frequency as $f_s/2N$, there is no folding of quantization noise due to the nulls created by FIR DAC.

Signal swing at the virtual ground of the first integrator is determined both from the input and the feedback DAC path. Since there are nulls created only in the feedback path, out-of-band interferers from multiples of $f_s/N$ can fold back to the signal bandwidth. FIG. 7 shows the interferer folding gain 755 with a 3-tap FIR DAC. There is a degradation of 42 dB in the folding amplitude compared to the folding gain 553 of a conventional 3-path chopper amplifier with 1% mismatch between the paths.

Figure 8:
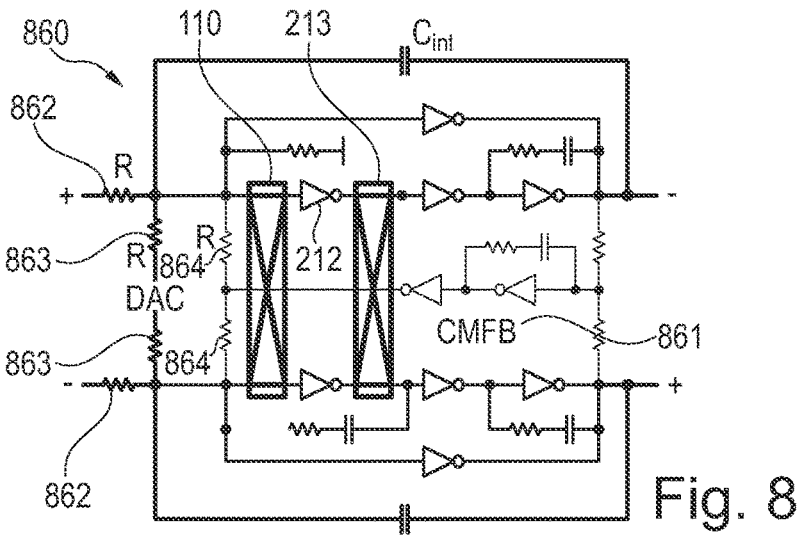
FIGS. 8 and 9 show the integration of a chopper circuit in an integrator circuit according to an exemplary embodiment of the present disclosure.
Figure 9:
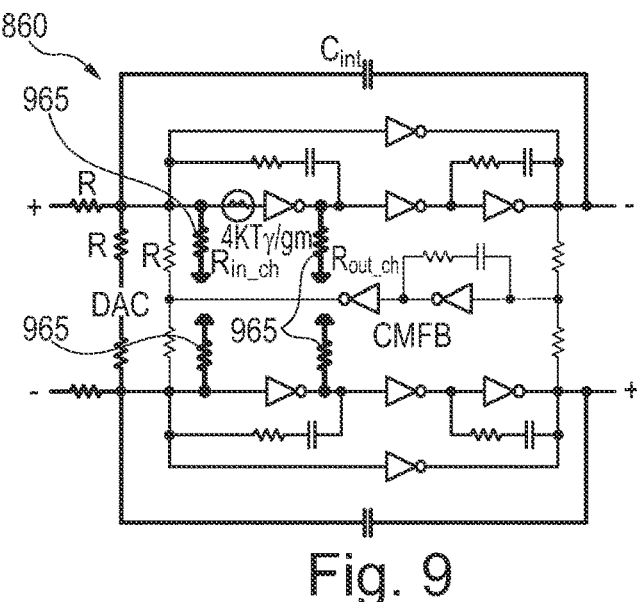

FIGS. 8 and 9 show the implementation of a chopper circuit, which comprises a chopper device 110, but could comprise further chopper devices, in an integrator circuit 860 according to an exemplary embodiment of the present disclosure. The integrator circuit 860 comprises a chopper amplifier circuit. The chopper amplifier circuit comprises the chopper device 110, an amplifier 212 and a demodulator 213. The chopper amplifier circuit may further comprise a common-mode feedback (CMFB) circuit 861 including CMFB resistors 864. The integrator circuit 860 further comprises input resistors 861 and DAC resistors 862.

In FIG. 9, the chopper device 110 and the demodulator (output chopper) 213 plus the corresponding parasitic capacitors (see FIG. 2) are replaced by respective switch-capacitor equivalent resistors 965. $R_{in\_ch}$ and $R_{out\_ch}$ are switch-capacitor equivalent resistors 965 of input and output choppers with $R_{in\_ch}=(\frac{1}{4} C_g f_{ch})$, where $C_g$ is the capacitance of the parasitic capacitor associated with the chopper device 110 and $f_{ch}$ is the frequency of chopper device 110.

Chopping the first integrator in a continuous-time delta-sigma modulator can cause the aliasing of the high-pass-shaped quantization noise from multiples of twice the chopping frequency into the signal bandwidth. Chopping at half the sampling frequency ($f_s/2$) can avoid this noise folding due to the NTF zeros at multiples of $f_s$. The disadvantage of this high-frequency chopping is increased amplifier's thermal noise when referred to the input of the delta-sigma ADC and reduced effective amplifier gain, which increases swing at the virtual ground and degrades linearity.

Figure 10:
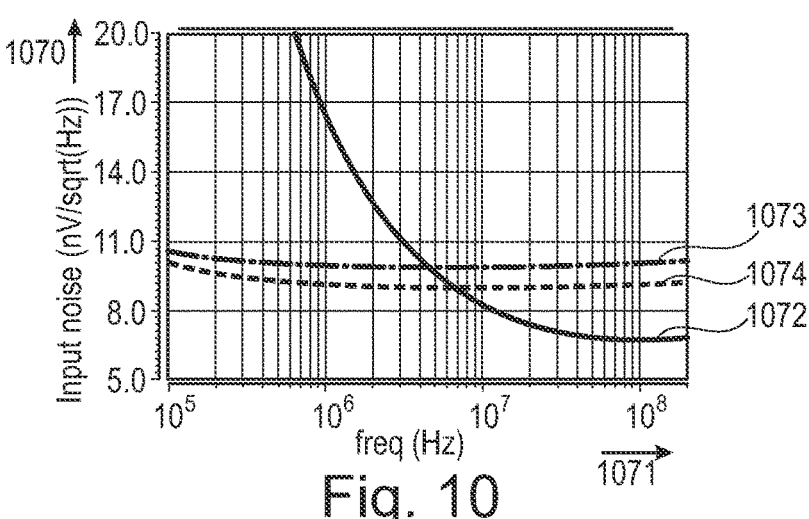
FIG. 10 illustrates input noise depending on frequency for different chopping methods.

FIG. 10 illustrates input noise (nV/√Hz) 1070 or input referred noise dependent on frequency (Hz) 1071 for different chopping methods for comparison. FIG. 10 shows the input-referred noise of the integrator of FIGS. 8 and 9. For the input noise 1072 without chopping, flicker noise is dominant till a few 10s MHz. For the input noise after chopping 1073, 1074, the flicker noise of the first stage is modulated to the chopping frequency and its odd harmonics. There is an increase in thermal noise after chopping due to the input switch-capacitor equivalent resistor. The expression for amplifier noise when referred to the input of the integrator, i.e. input referred amplifier noise, is: $(4KT\gamma/g_m)$ $(R/R_{in}\|R_{DAC}\|R_{CMFB}\|R_{in\_ch})^2$, where $g_m$ is transconductance of the amplifier, $R_{in}$ is the resistance of the input resistor 862, $R_{DAC}$ is the resistance of the DAC resistor 863, $R_{CMFB}$ is the resistance of the CMFB resistor 864 and $R_{in\_ch}$ is the resistance of the switch-capacitor equivalent resistor 965 of the (input) chopper device 110.

Input and output switch capacitor resistors increase with reducing the chopping frequency. So, the thermal noise and amplifier's gain improve by reducing the chopping frequency (compare input noise 1073 for chopping at $f_s$ and input noise 1074 for chopping at $f_s/2$). Unfortunately, reducing the chopping frequency below $f_s/2$ can cause the aliasing of quantization noise into the signal band. Multi-path chopping as described in the present disclosure is a technique to improve these chopping artifacts while effectively chopping at $f_s/2$.

In this specification, embodiments have been presented in terms of a selected set of details. However, a person of ordinary skill in the art would understand that many other embodiments may be practiced which include a different selected set of these details. It is intended that the following claims cover all possible embodiments.

REFERENCE NUMERALS

100 chopper circuit
102 input signal
103 output signal
110 first chopper device
111 first circuit path
120 second chopper device
121 second circuit path
130 third chopper device
131 third circuit path
201 chopper amplifier circuit
212 first path amplifier
213 first path demodulator
214 first path parasitic capacitor
222 second path amplifier
223 second path demodulator
224 second path parasitic capacitor
232 third path amplifier
233 third path demodulator
234 third path parasitic capacitor
315 first clock signal
325 second clock signal
335 third clock signal
340 reference clock signal
341 upward clock edge
342 downward clock edge
550 interferer frequency
551 folding gain
552 folding gain ($f_s/2$)
553 folding gain ($f_s/6$, three-path chopping)
654 folding gain (chopping clocks with different frequencies)
755 folding gain (3-tap FIR)
860 integrator circuit
861 common-mode feedback (CMFB) circuit
862 input resistor
863 DAC resistor
864 CMFB resistor
965 switch-capacitor equivalent resistor
1070 input noise
1071 frequency
1072 input noise (without chopping)
1073 input noise (chopping at $f_s$)
1074 input noise (chopping at $f_s/2$)

The invention claimed is:

1. A chopper circuit for a multipath chopper amplifier, comprising:

a first chopper device in a first circuit path, wherein the first chopper device is configured to receive a first path signal and to be controlled by a first clock signal, which has a first frequency; and a second chopper device in a second circuit path, parallel to the first circuit path, wherein the second chopper device is configured to receive a second path signal and to be controlled by a second clock signal, which has a second frequency, wherein the first path signal and the second path signal are the same, and the first frequency is greater than the second frequency.

2. The chopper circuit according to claim 1, wherein the first frequency is half a sampling frequency or a multiple of half the sampling frequency.

3. The chopper circuit according to claim 1, wherein the second frequency is in a range from 1 to 1.5 times a sum of a signal bandwidth plus a flicker noise corner frequency.

4. The chopper circuit according to claim 1, wherein at least one of the first and second clock signals comprises at least one of upward clock edges, which occur with the frequency of the respective clock signal, and downward clock edges, which occur with the frequency of the respective clock signal.

5. A chopper circuit for a multipath chopper amplifier, comprising:

a first chopper device in a first circuit path, wherein the first chopper device is configured to be controlled by a first clock signal, which has a first frequency; and a second chopper device in a second circuit path, parallel to the first circuit path, wherein the second chopper device is configured to be controlled by a second clock signal, which has a second frequency, wherein the first frequency is greater than the second frequency, and wherein the first frequency is a multiple of the second frequency.

6. A chopper circuit for a multipath chopper amplifier, comprising:

a first chopper device in a first circuit path, wherein the first chopper device is configured to be controlled by a first clock signal, which has a first frequency; and a second chopper device in a second circuit path, parallel to the first circuit path, wherein the second chopper device is configured to be controlled by a second clock signal, which has a second frequency, wherein the first frequency is greater than the second frequency, and wherein, in the first clock signal, upward clock edges are omitted with a frequency equal to the second frequency.

7. A chopper circuit for a multipath chopper amplifier, comprising:

a first chopper device in a first circuit path, wherein the first chopper device is configured to be controlled by a first clock signal, which has a first frequency;

a second chopper device in a second circuit path, parallel to the first circuit path, wherein the second chopper device is configured to be controlled by a second clock signal, which has a second frequency, wherein the first frequency is greater than the second frequency; and a third chopper device in a third circuit path, wherein the third chopper device is configured to be controlled by a third clock signal, which has a third frequency.

8. The chopper circuit according to claim 7, wherein the third frequency equals the second frequency.

9. The chopper circuit according to claim 7, wherein the third clock signal corresponds to the second clock signal shifted in time such that a time difference between an upward clock edge of the second clock signal and a downward clock edge of the third clock signal is one over twice the first frequency.

10. The chopper circuit according to claim 7, wherein a combined clock signal composed of the first, the second and the third clock signals has exactly one upward clock edge or downward clock edge occurring at a sampling frequency.

11. The chopper circuit according to claim 7, further comprising at least one further chopper device, each of the first chopper device, the second chopper device, the third chopper device, and the at least one further chopper device being in a respective circuit path and each configured to be controlled by a respective clock signal having a respective frequency, wherein a combined clock signal has exactly one upward clock edge or downward clock edge occurring at a sampling frequency.

12. A chopper amplifier circuit comprising:
a chopper circuit that includes
a first chopper device in a first circuit path, wherein the first chopper device is configured to receive a first path signal and to be controlled by a first clock signal, which has a first frequency, and
a second chopper device in a second circuit path, parallel to the first circuit path, wherein the second chopper device is configured to receive a second path signal and to be controlled by a second clock signal, which has a second frequency, wherein the first path signal and the second path signal are the same, and the first frequency is greater than the second frequency.

13. An integrator circuit comprising the chopper amplifier circuit according to claim 12.

14. A method of chopping an input signal comprising:
splitting the input signal so that a first path signal for a first circuit path and a second path signal for a second circuit path are provided, where the second circuit path is parallel with the first circuit path, and wherein the first path signal and the second path signal are the same;
chopping the first path signal by means of a first chopper device in the first circuit path, wherein the first chopper device is controlled by a first clock signal, which has a first frequency; and
chopping the second path signal by means of a second chopper device in the second circuit path, wherein the second chopper device is controlled by a second clock signal, which has a second frequency, wherein the first frequency is greater than the second frequency.

15. The method according to claim 14, wherein the first frequency is half a sampling frequency or a multiple of half the sampling frequency.

16. The method according to claim 14, wherein the second frequency is in the range from 1 to 1.5 times the sum of a signal bandwidth plus a flicker noise corner frequency.

17. A method of chopping an input signal comprising:
splitting the input signal so that a first path signal for a first circuit path, a second path signal for a second circuit path, and a third path signal for a third circuit path are provided;
chopping the first path signal by means of a first chopper device in the first circuit path, wherein the first chopper device is controlled by a first clock signal, which has a first frequency;
chopping the second path signal by means of a second chopper device in the second circuit path, wherein the second chopper device is controlled by a second clock signal, which has a second frequency, wherein the first frequency is greater than the second frequency; and
chopping the third path signal by means of a third chopper device in the third circuit path, wherein the third chopper device is controlled by a third clock signal, which has a third frequency.

18. The method according to claim 17, wherein at least one of the first and second clock signals comprises at least one of upward clock edges, which occur with the frequency of the respective clock signal, and downward clock edges, which occur with the frequency of the respective clock signal.

19. The method according to claim 18, wherein a time difference between an upward clock edge of the second clock signal and a downward clock edge of the third clock signal is one over twice the first frequency.

20. The method according to claim 17, wherein a combined clock signal composed of the first, the second and the third clock signals has exactly one upward clock edge or downward clock edge occurring at a sampling frequency.

* * * * *